United States Patent
Yamamoto et al.

(10) Patent No.: US 12,021,520 B2
(45) Date of Patent: Jun. 25, 2024

(54) RESONATOR, OSCILLATOR, AND QUANTUM COMPUTER

(71) Applicant: NEC Corporation, Tokyo (JP)

(72) Inventors: Tsuyoshi Yamamoto, Tokyo (JP);
Tomohiro Yamaji, Tokyo (JP);
Yoshihito Hashimoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 31 days.

(21) Appl. No.: 17/626,567

(22) PCT Filed: Jun. 26, 2020

(86) PCT No.: PCT/JP2020/025234
§ 371 (c)(1),
(2) Date: Jan. 12, 2022

(87) PCT Pub. No.: WO2021/014885
PCT Pub. Date: Jan. 28, 2021

(65) Prior Publication Data
US 2022/0247407 A1 Aug. 4, 2022

(30) Foreign Application Priority Data
Jul. 19, 2019 (JP) .................................. 2019-133814

(51) Int. Cl.
*H03K 17/92* (2006.01)
*G06N 10/40* (2022.01)
*H03B 15/00* (2006.01)

(52) U.S. Cl.
CPC ............. *H03K 17/92* (2013.01); *G06N 10/40* (2022.01); *H03B 15/003* (2013.01)

(58) Field of Classification Search
CPC ....................................................... H03K 17/92
USPC ........................................................... 327/528
See application file for complete search history.

(56) References Cited

U.S. PATENT DOCUMENTS

| | | |
|---|---|---|
| 2004/0077503 A1 | 4/2004 | Blais et al. |
| 2018/0240034 A1 | 8/2018 | Harris |
| 2019/0065981 A1* | 2/2019 | Chen ................. H10N 69/00 |

FOREIGN PATENT DOCUMENTS

| JP | H09-139528 A | 5/1997 |
|---|---|---|
| JP | 2005-527902 A | 9/2005 |
| JP | 2017-73106 A | 4/2017 |
| JP | 2018-533106 A | 11/2018 |
| JP | 2019-036625 A | 3/2019 |
| JP | 2019-041088 A | 3/2019 |

OTHER PUBLICATIONS

International Search Report for PCT Application No. PCT/JP2020/025234, dated Sep. 15, 2020.
S. Puri et al., "Quantum annealing with all-to-all connected nonlinear oscillators", Nature Communications, 8:15785, DOI:10.1038/ncomms15785, Published Jun. 8, 2017, pp. 1-9.

* cited by examiner

Primary Examiner — Tomi Skibinski
(74) Attorney, Agent, or Firm — Sughrue Mion, PLLC (57) ABSTRACT

A resonator, an oscillator, and a quantum computer in which the area occupied by the circuit can be reduced is provided. A resonator (100) includes a loop circuit (110) in which a first superconducting line (101), a first Josephson junction (103), a second superconducting line (102), and a second Josephson junction (104) are connected in a ring shape, and a capacitor (120). The capacitor (120) and the loop circuit (110) are connected in a ring shape.

10 Claims, 7 Drawing Sheets

RESONATOR, OSCILLATOR, AND QUANTUM COMPUTER

This application is a National Stage Entry of PCT/JP2020/025234 filed on Jun. 26, 2020, which claims priority from Japanese Patent Application 2019-133814 filed on Jul. 19, 2019, the contents of all of which are incorporated herein by reference, in their entirety.

TECHNICAL FIELD

The present invention relates to a resonator, an oscillator, and a quantum computer. In particular, the present invention relates to a resonator, an oscillator, and a quantum computer using a superconducting circuit.

BACKGROUND ART

Researches on circuits using superconducting elements have been conducted. For example, Patent Literature 1 discloses a high-frequency oscillator using a superconducting element. Further, recently, researches on quantum computers using superconducting elements have also been conducted. For example, Patent Literature 2 and Non-patent Literature 1 propose a quantum computer using a network of nonlinear oscillators. The nonlinear oscillators used in such quantum computers are required to have moderate nonlinearity and as low losses as possible. Note that the nonlinearity of the nonlinear oscillator is quantified by a nonlinear coefficient. The nonlinear coefficient is a coefficient defined by a coefficient of a nonlinear term of the Hamiltonian of the nonlinear oscillator as will be described later.

CITATION LIST

Patent Literature

Patent Literature 1: Japanese Unexamined Patent Application Publication No. H09-139528
Patent Literature 2: Japanese Unexamined Patent Application Publication No. 2017-73106

Non Patent Literature

Non-patent Literature 1: S. Puri, et al, "Quantum annealing with all-to-all connected nonlinear oscillators," Nature Comm., 2017.

SUMMARY OF INVENTION

Technical Problem

Each of the aforementioned Patent Literature 2 and Non-patent Literature 1 discloses a configuration of a quantum computer in which a distributed constant-type Josephson parametric oscillator is used as a nonlinear oscillator. The distributed constant-type Josephson parametric oscillator is composed of a distributed constant-type resonator and a Josephson junction. The distributed constant-type resonator has a length roughly equal to the wavelength of an electromagnetic wave corresponding to the oscillation frequency of the parametric oscillator on a circuit board. Note that the aforementioned circuit board refers to a substrate on which a Josephson parametric oscillator is formed. In general, the aforementioned oscillation frequency is, for example, about 10 GHz, so that the length of the distributed constant-type resonator corresponding to this frequency is in the order of millimeters. Therefore, the length of the distributed constant-type resonator is very long.

Meanwhile, in order to realize a practical quantum computer, it is necessary to integrate, for example, several thousands of nonlinear oscillators on a chip of several millimeters square. However, there is a problem that the distributed constant-type Josephson parametric oscillator is not suitable for such integration because the area occupied by the resonator thereof is too large.

An object of the present disclosure is to provide a resonator, an oscillator, and a quantum computer in which the area occupied by the circuit can be reduced.

Solution to Problem

A resonator according to an example embodiment includes:
a loop circuit in which a first superconducting line, a first Josephson junction, a second superconducting line, and a second Josephson junction are connected in a ring shape; and
a capacitor, in which
the capacitor and the loop circuit are connected in a ring shape.

Advantageous Effects of Invention

According to the above-described configuration, it is possible to provide a resonator, an oscillator, and a quantum computer in which the area occupied by the circuit can be reduced.

EXAMPLE EMBODIMENTS

Details of an example embodiment will be described hereinafter. Note that a resonator described in the example embodiment is implemented by, for example, lines (wiring lines) formed of a superconductor on a silicon substrate. For example, while Nb (niobium) or Al (aluminum) is, for example, used as a material of this line, any other metal such as Mo (molybdenum) or Ta (tantalum) which is in a superconducting state when it is cooled to an extremely low temperature may be used. Further, in order to achieve the superconducting state, a circuit of the resonator is used in a temperature environment such as 10 mK (milli-Kelvin) achieved in a freezer.

Further, in the following description, the Josephson junction means an element including a structure in which a thin insulating film is sandwiched between a first superconductor and a second superconductor.

First Example Embodiment

Figure 1:
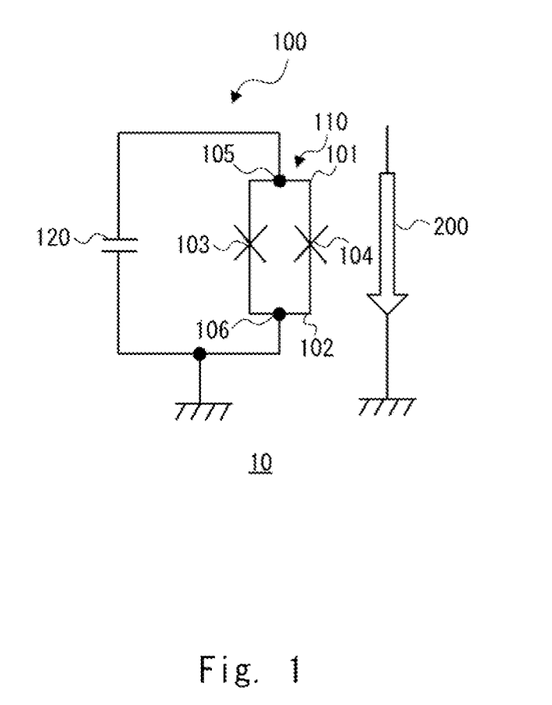
FIG. 1 is a schematic diagram showing an example of a lumped constant-type Josephson parametric oscillator according to a first example embodiment.

As mentioned above, the distributed constant-type Josephson parametric oscillator is not suitable for the integration because the area occupied by the resonator thereof is too large. In order to solve this problem and thereby to realize a practical quantum computer, it is necessary to realize a lumped constant-type Josephson parametric oscillator. The lumped constant-type Josephson parametric oscillator can be realized by, for example, a circuit like the one shown in FIG. 1. FIG. 1 is a schematic diagram showing an example of a lumped constant-type Josephson parametric oscillator 10 according to a first example embodiment.

As shown in FIG. 1, the Josephson parametric oscillator 10 includes a resonator 100 and a magnetic-field generation unit 200. The resonator 100 includes a loop circuit 110 and a capacitor 120. The loop circuit 110 includes a first superconducting line 101 that connects a first Josephson junction 103 and a second Josephson junction 104, and a second superconducting line 102 that connects the first Josephson junction 103 and the second Josephson junction 104. In other words, the resonator 100 includes the loop circuit 110 in which the first and second superconducting lines 101 and 102 are joined by the first and second Josephson junctions 103 and 104, and the capacitor 120. As shown in FIG. 1, the first superconducting line 101, the first Josephson junction 103, the second superconducting line 102, and the second Josephson junction 104 are connected in a ring shape (i.e., in a circular fashion), thereby forming the loop circuit 110. In other words, in the loop circuit 110, the first and second superconducting lines 101 and 102 are joined by the first and second Josephson junctions 103 and 104, thereby forming a loop. That is, it can also be said that the loop circuit 110 is a DC-SQUID (Superconducting QUantum Interference Device).

The loop circuit 110 is shunted by the capacitor 120. That is, a first part 105 of the first superconducting line 101 and a second part 106 of the second superconducting line 102 are shunted by the capacitor 120. In other words, in the resonator 100, the input/output ends of the DC-SQUID are shunted by the capacitor 120. That is, it can be said that, by connecting the capacitor 120 and the loop circuit 110 in a ring shape, a loop circuit in which the loop circuit 110 is incorporated on the line of the loop is formed. Note that, in the following description, a circuit for shunting is also referred to as a shunt circuit. Note that the first part 105 is an arbitrary part of the first superconducting line 101. That is, the position of the first part 105 in the first superconducting line 101 is not limited to any particular place. Similarly, the second part 106 is an arbitrary part of the second superconducting line 102. That is, the position of the second part 106 in the second superconducting line 102 is not limited to any particular place.

The magnetic-field generation unit 200 is a circuit that generates an alternating magnetic field and applies the generated alternating magnetic field to the loop circuit 110. The magnetic-field generation unit 200 is a circuit through which an AC (Alternating Current) current flows, and generates an alternating magnetic field by the AC current. More specifically, a current in which a DC (Direct Current) current and an AC current are superimposed on each other flows through the magnetic-field generation unit 200. As will be described later, the magnitude of the magnetic flux and the height of the oscillation frequency (the resonance frequency) are controlled by the amount of the DC current. Although the magnetic-field generation unit 200 is represented by one wiring line in FIG. 1, it may be formed by two wiring lines, and may be configured so that the DC current flows through one of the wiring lines and the AC current flows through the other wiring line.

When an AC current is fed to the magnetic-field generation unit 200 so that an alternating magnetic field whose frequency is twice the resonance frequency of the resonator 100 is applied to the loop circuit 110, the Josephson parametric oscillator 10 oscillates at this resonance frequency (i.e., the oscillation frequency 0.5 times (i.e., a half of) the frequency of the alternating magnetic field). This oscillation is called parametric oscillation.

As described above, according to the configuration shown in FIG. 1, a lumped constant-type oscillator can be formed. In the case of the lumped constant-type oscillator, there is no need to use a resonator having roughly the same length as the wavelength of an electromagnetic wave corresponding to the oscillation frequency, so that the area occupied by the circuit can be reduced.

As described above, according to the first example embodiment, it is possible to provide a resonator and an oscillator in which the area occupied by the circuit can be reduced. Note that the Josephson parametric oscillator 10 shown in FIG. 1 can be used in the quantum computer disclosed in the above-described Patent Literature 2 and that disclosed in Non-patent Literature 1. However, as will be described later, it is not easy to reduce the nonlinear coefficient while keeping the loss low. Therefore, when the Josephson parametric oscillator is used in the quantum computer disclosed in Patent Literature 2 or that disclosed in Non-patent Literature 1, desired performance could not be obtained. That is, if it is possible to reduce the nonlinear coefficient to a moderate value required for a quantum computer while keeping the loss low, it may be possible to provide a quantum computer having superior performance. The fact that it is not easy to reduce the nonlinear coefficient while keeping the loss low in the Josephson parametric oscillator 10 shown in FIG. 1 will be described hereinafter in detail. Note that, in the following description, the Josephson parametric oscillator may also be referred to as a nonlinear oscillator.

The Hamiltonian H of the lumped constant-type Josephson parametric oscillator 10 shown in FIG. 1 is expressed by the below-shown Expression (1).

[Expression 1]

$$H = hf_{J0}\left(a^\dagger a + \frac{1}{2}\right) - \frac{E_C}{12}(a^\dagger + a)^4 \quad (1)$$

In the Expression (1), h is the Planck's constant, and $f_{J0}$ is the oscillation frequency of the nonlinear oscillator. $a^\dagger$ is a creation operator. a is an annihilation operator. Further, $E_C$ is expressed by the below-shown Expression (2).

[Expression 2]

$$E_C = \frac{e^2}{2C_r} \quad (2)$$

In the Expression (2), e is the elementary charge and $C_r$ is the capacitance of the capacitor 120 used for the shunting.

Further, $f_{J0}$ in the Expression (1) is expressed by the below-shown Expression (3).

[Expression 3]

$$2\pi f_{J0} = \frac{1}{\sqrt{L_J(C_r + 2C_J)}} \quad (3)$$

In the Expression (3), $C_J$ is the capacitance of each of the first and second Josephson junctions 103 and 104. Meanwhile, in the Expression (3), $L_J$ is the equivalent inductance of the loop circuit 110, and is defined by the below-shown Expression (4).

[Expression 4]

$$L_J = \frac{\Phi_0}{4\pi I_C \cos\left(\frac{\pi\Phi}{2\Phi_0}\right)} \quad (4)$$

In the Expression (4), $I_C$ is the critical current value of each of the first and second Josephson junctions 103 and 104, and $\Phi$ is the magnetic flux applied to the loop circuit 110. Further, $\Phi_0$ is the flux quantum (is about $2.07 \times 10^{-15}$ Wb). As can be seen from the Expression (4), the equivalent inductance $L_J$ of the loop circuit 110 can be changed by changing the magnetic flux $\Phi$ applied to the loop circuit 110. The magnetic flux $\Phi$ can be changed by changing the amount of the current fed to the magnetic-field generation unit 200. More specifically, the magnetic flux $\Phi$ can be changed by the amount of the DC current superimposed on the AC current fed to the magnetic-field generation unit 200. Further, as can be seen from the Expressions (3) and (4), the oscillation frequency can be controlled by the amount of the current fed to the magnetic-field generation unit 200.

As described above, the nonlinear coefficient of a nonlinear oscillator is defined by a coefficient of a nonlinear term of the Hamiltonian of the nonlinear oscillator. In the present disclosure, the nonlinear coefficient K of the nonlinear oscillator is defined as the value obtained by multiplying the absolute value of the coefficient of the nonlinear term of the Hamiltonian of the nonlinear oscillator by 12 and then dividing the resultant value by the Planck's constant h. In the Hamiltonian of the Expression (1), the second term, i.e., the term $(a^\dagger + a)^4$, is the nonlinear term. Therefore, the nonlinear coefficient K of the nonlinear oscillator shown in FIG. 1 is expressed by the below-shown Expression (5).

[Expression 5]

$$K = \frac{E_C}{h} = \frac{e^2}{2hC_r} \quad (5)$$

From the Expression (5), it can be understood that the nonlinear coefficient K of the nonlinear oscillator shown in FIG. 1 is determined by the value of the capacitance $C_r$ of the capacitor 120.

It should be noted that when the quantum computer disclosed in Patent Literature 2 or Non-patent Literature 1 is manufactured, the oscillation frequency of the nonlinear oscillator is desirably not lower than 5 GHz and not higher than 40 GHz. The reason for this is as follows. When the frequency is lower than 5 GHz, the probability of a malfunction of the quantum computer due to thermal noises increases to a non-negligible level. When the frequency is higher than 40 GHz, very expensive high-frequency electronic devices and very expensive high-frequency electronic components are required to operate the quantum computer. Therefore, an oscillation frequency not lower than 5 GHz and not higher than 40 GHz is desirably used.

Further, the critical current value $I_C$ of each of the first and second Josephson junctions 103 and 104 constituting the nonlinear oscillator is desirably not smaller than 10 nA and not larger than 0.1 mA. The reason for this is as follows. When the critical current value $I_C$ is smaller than 10 nA, the output signal of the nonlinear oscillator is too small, causing a problem that the reading-out thereof becomes difficult. Further, when the critical current value $I_C$ is larger than 0.1 mA, the equivalent inductance $L_J$ of the loop circuit 110 decreases, so that the capacitance $C_r$ of the capacitor 120 must be increased in order to achieve the predetermined oscillation frequency $f_{J0}$. As a result, there is a problem that the loss of the nonlinear oscillator increases to a non-negligible level. The fact that the equivalent inductance $L_J$ of the loop circuit 110 decreases as the critical current value increases can be understood from the fact that the equivalent inductance $L_J$ decreases as the critical current value $I_C$ increases in the Expression (4). The reason why the capacitance $C_r$ has to be increased to achieve the predetermined oscillation frequency $f_{J0}$ can be understood from the fact that when the equivalent inductance $L_J$ is reduced in the Expression (3), the predetermined $f_{J0}$ cannot be maintained unless the capacitance $C_r$ is increased. The reason why the loss increases as the capacitance $C_r$ increases is as follows. That is, in order to manufacture a large capacitance in a sufficiently small area suitable for an integrated circuit, it is necessary to use a capacitor having a multi-layered structure. However, in the case of the capacitor having a multi-layered structure, it is difficult to manufacture, by using the existing technology, a dielectric layer the loss caused by which is small. Note that the dielectric layer is a layer of a dielectric material formed between two electrodes of a capacitor. In order to sufficiently reduce the loss, the capacitance $C_r$ is desirably not larger than 1 pF.

Meanwhile, the nonlinear coefficient K is desirably not lower than 1 MHz and not higher than 10 MHz in a quantum computer. The reason for this is as follows. When the nonlinear coefficient K is lower than 1 MHz, the time required for quantum calculation becomes too long, causing a problem that the quantum calculation cannot be completed in the period during which the quantum computer is maintaining the quantum state. Further, when the nonlinear coefficient K is higher than 10 MHz, the output signal of the nonlinear oscillator becomes too small, causing a problem that the reading-out thereof becomes difficult.

When the critical current value $I_C$ of the Josephson junction is adjusted to a value not smaller than 10 nA and not larger than 0.1 mA, the equivalent inductance $L_J$ of the loop circuit 110 falls within a range of not smaller than 1.85 pH and not larger than 18.5 nH according to the Expression (4). Note that, for the calculation, the value of the magnetic flux $\Phi$ was set to $0.3\Phi_0$ in the Expression (4). The reason why the value of the magnetic flux $\Phi$ was set to $0.3\Phi_0$ is that when the magnetic flux $\Phi$ is too small, the nonlinear oscillator becomes less likely to oscillate. On the other hand, when the magnetic flux $\Phi$ is too large, it becomes sensitive to magnetic-field noises and hence the oscillation frequency becomes unstable. Therefore, the oscillator is desirably operated with the magnetic flux $\Phi$ of about $0.3\Phi_0$. Further, the capacitance $C_J$ of the Josephson junction is not smaller than 0.1 fF and not larger than 1 pF in the existing component manufacturing technology. For these values of the equivalent inductance $L_J$ and the capacitance $C_J$, the capacitance $C_r$ with which the oscillation frequency $f_{r0}$ of the Josephson parametric oscillator 10 shown in FIG. 1 falls within a range of not lower than 5 GHz and not higher than 40 GHz can be calculated by using the Expression (3). Further, the nonlinear coefficient K for the calculated capacitance $C_r$ can be calculated by using the Expression (5). When the nonlinear coefficient K in the Josephson parametric oscillator 10 in FIG. 1 is actually calculated, the nonlinear coefficient K does not fall within the range of not lower than 1 MHz and not higher than 10 MHz. Alternatively, even when the nonlinear coefficient K falls within the range of not lower than 1 MHz and not higher than 10 MHz, the capacitance $C_r$ becomes larger than 1 pF.

As described above, in the Josephson parametric oscillator 10 shown in FIG. 1, when it is attempted to achieve the desired oscillation frequency by using a Josephson junction(s) having a desired critical current value, it is not always easy to achieve both moderate nonlinearity and a low loss required for a quantum computer. Therefore, it has been required to realize a new lumped constant-type Josephson parametric oscillator capable of achieving both moderate nonlinearity and as a small loss as possible required for a quantum computer.

A configuration in which both moderate nonlinearity and a low loss are achieved, and the area occupied by the circuit can be reduced will be described hereinafter in detail. Note that in the following description, the same reference numerals (or symbols) are used for the same components that are already described above, and detailed descriptions thereof are omitted as appropriate. Further, redundant descriptions of the definitions of variables in expressions are also omitted as appropriate.

Second and third example embodiments described hereinafter are in common to each other in that the loop circuit 110 is shunted by a capacitor and a linear inductor. However, in the second example embodiment, the capacitor and the linear inductor, which are used for the shunting, are connected in series. In contrast to this, in the third example embodiment, the capacitor and the linear inductor, which are used for the shunting, are connected in parallel.

Second Example Embodiment

Figure 2:
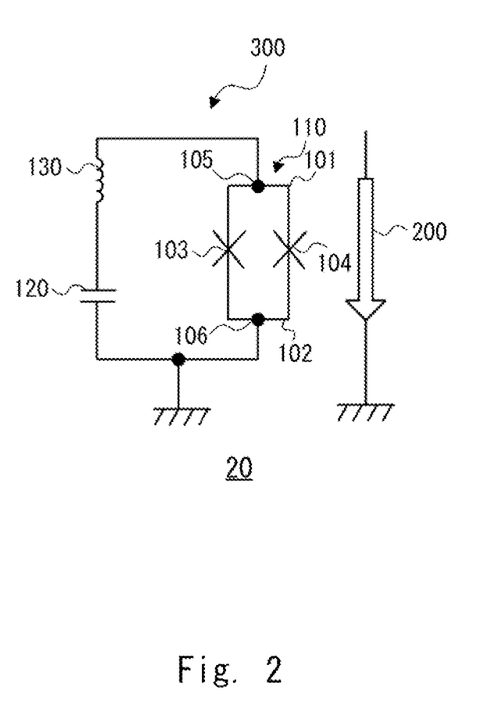
FIG. 2 is a schematic diagram showing a configuration of a Josephson parametric oscillator according to a second example embodiment.

FIG. 2 is a schematic diagram showing a configuration of a superconducting nonlinear oscillator (a Josephson parametric oscillator) according to the second example embodiment. As shown in FIG. 2, the oscillator 20 includes a resonator 300 and a magnetic-field generation unit 200. The resonator 300 includes a loop circuit 110, a capacitor 120, and a linear inductor 130. The loop circuit 110 includes a first superconducting line 101 that connects a first Josephson junction 103 and a second Josephson junction 104, and a second superconducting line 102 that connects the first Josephson junction 103 and the second Josephson junction 104. In other words, the resonator 300 includes the loop circuit 110 in which the first superconducting line 101 and the second superconducting line 102 are joined by the first and second Josephson junctions 103 and 104, the capacitor 120, and the linear inductor 130.

In the resonator 300, the loop circuit 110 is shunted by a circuit in which the capacitor 120 and the linear inductor 130 are connected in series. That is, the first part 105 of the first superconducting line 101 and the second part 106 of the second superconducting line 102 are shunted by the capacitor 120 and the linear inductor 130 connected in series. In other words, in the resonator 300, the input/output ends of the DC-SQUID are shunted by the capacitor 120 and the linear inductor 130 connected in series. That is, it can be said that, by connecting the series circuit composed of the capacitor 120 and the linear inductor 130 with the loop circuit 110 in a ring shape, a loop circuit in which the loop circuit 110 is incorporated on the line of the loop is formed. Note that as shown in FIG. 2, one end of the loop circuit may be connected to the ground.

The magnetic-field generation unit 200 and the resonator 300 are magnetically coupled with each other through the mutual inductance. In other words, the magnetic-field generation unit 200 and the resonator 300 are inductively coupled with each other. In the configuration shown in FIG. 2, parametric oscillation is also performed by the generation of an alternating magnetic field. That is, when an AC current is fed to the magnetic-field generation unit 200 so that an alternating magnetic field whose frequency is twice the resonance frequency of the resonator 300 is applied to the loop circuit 110, the oscillator 20 oscillates at this resonance frequency (i.e., the oscillation frequency 0.5 times (i.e., a half of) the frequency of the alternating magnetic field). Note that the frequency of the alternating magnetic field is equal to the frequency of the AC current. Further, in this example embodiment, as can be seen from the Expression (4) and the below-described Expression (8), the oscillation frequency can be controlled by the amount of the current fed to the magnetic-field generation unit 200. Although the magnetic-field generation unit 200 is represented by one wiring line in FIG. 2, it may be formed by two wiring lines, and may be configured so that the DC current flows through one of the wiring lines and the AC current flows through the other wiring line.

The Hamiltonian H of the oscillator 20 shown in FIG. 2 (the Hamiltonian H of the resonator 300) is expressed by the below-shown Expression (6).

[Expression 6]

$$H = hf_0\left(a^\dagger a + \frac{1}{2}\right) - \frac{E_C}{12}\left(\frac{L_J}{L_r + L_J}\right)^3 (a^\dagger + a)^4 \quad (6)$$

In the Expression (6), $L_r$ is the inductance of the linear inductor 130. Further, $f_0$ is the oscillation frequency of the oscillator 20. In the Hamiltonian H in the Expression (6), the second term, i.e., the term $(a^\dagger+a)^4$, is the nonlinear term.

Therefore, the nonlinear coefficient K of the oscillator 20 in this example embodiment is shown by the below-shown Expression (7).

[Expression 7]

$$K = \frac{E_C}{\hbar}\left(\frac{L_j}{L_r + L_J}\right)^3 = \frac{e^2}{2\hbar C_r}\left(\frac{L_j}{L_r + L_J}\right)^3 \quad (7)$$

When $L_r=0$ in the Expression (7), the nonlinear coefficient K (i.e., the Expression (7)) becomes identical to the Expression (5). This fact corresponds to the fact that when the linear inductor 130 is removed from the oscillator 20 in this example embodiment, it becomes the nonlinear oscillator shown in FIG. 1. In other words, the oscillator 20 according to this example embodiment is an oscillator that is obtained by inserting the linear inductor 130 in the nonlinear oscillator shown in FIG. 1. As can be seen from the Expression (7), the larger the inductance $L_r$ of the linear inductor 130 is, the more the nonlinear coefficient K can be reduced. Therefore, in the oscillator 20 according to this example embodiment, it is possible to reduce the nonlinear coefficient K to a moderate value required for a quantum computer without increasing the capacitance $C_r$ of the capacitor 120 used for the shunting. Therefore, it provides an advantageous effect that the nonlinear coefficient can be lowered to a moderate value required for a quantum computer without increasing the loss of the nonlinear oscillator.

Note that the oscillation frequency $f_0$ of the oscillator 20 according to this example embodiment shown in FIG. 2 is expressed by the below-shown Expression (8). Note that, in the Expression (8), the capacitance $C_J$ of each of the first and second Josephson junctions 103 and 104 is ignored. This is because the effect of the capacitance of the Josephson junction is negligibly small in the circuit shown in FIG. 2.

[Expression 8]

$$2\pi f_0 = \frac{1}{\sqrt{(L_r + L_J)C_r}} \quad (8)$$

In this example embodiment, the oscillation frequency $f_0$ of the oscillator 20 is also preferably not lower than 5 GHz and not higher than 40 GHz. Further, the critical current value $I_C$ of each of the first and second Josephson junctions 103 and 104 constituting the oscillator 20 is preferably not smaller than 10 nA and not larger than 0.1 mA.

When the critical current value $I_C$ of the Josephson junction is adjusted to a value not smaller than 10 nA and not larger than 0.1 mA, the equivalent inductance $L_J$ of the loop circuit 110 falls within a range of not smaller than 1.85 pH and not larger than 18.5 nH according to the Expression (4). Note that, for the calculation, the value of the magnetic flux $\Phi$ was set to $0.3\Phi_0$ in the Expression (4). When the equivalent inductance is not smaller than 1.85 pH and not larger than 18.5 nH, it is possible to adopt, based on the Expression (8), various combinations of the inductance $L_r$ and the capacitance $C_r$ with which the oscillation frequency $f_0$ of the oscillator 20 falls within the range of not lower than 5 GHz and not higher than 40 GHz. From among such combinations, by using (i.e., selecting) a combination of the inductance $L_r$ and the capacitance $C_r$ with which the nonlinear coefficient K in the Expression (7) can be adjusted to a value not lower than 1 MHz and not higher than 10 MHz, it is possible to realize a nonlinear oscillator having a moderate nonlinearity required for a quantum computer.

For example, assume that: the oscillation frequency $f_0$ is selected to be 10 GHz; the critical current value $I_C$ of the Josephson junction is 0.83 µA; the capacitance $C_r$ is 0.57 pF; and the inductance $L_r$ is 225 pH. Then, the nonlinear coefficient K is calculated as 4.2 MHz. That is, in this case, it is possible to achieve a moderate nonlinearity required for a quantum computer.

As described above, the value of the inductance of the linear inductor 130 is set in advance based on the equivalent inductance $L_J$, the oscillation frequency $f_0$, the critical current value $I_C$ of the Josephson junction(s), and the capacitance $C_r$ so that the nonlinear coefficient K has a predetermined value. That is, the linear inductor 130 is designed so that its inductance is not a floating inductance but has a predetermined value. In other words, the linear inductor 130 is an inductor that exists as a non-floating component. For example, the linear inductor 130 may be provided as a meander wiring line or as a coil, but how to provide (or form) the linear inductor 130 is not limited to these examples.

Figure 3:
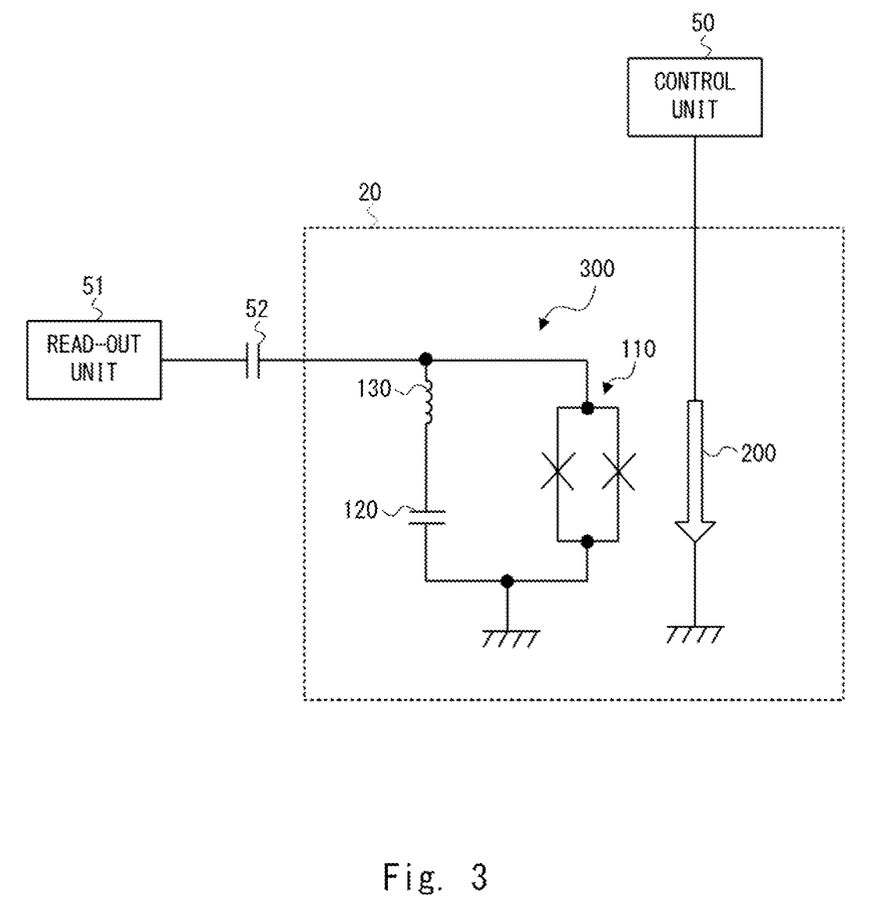
FIG. 3 is a schematic diagram showing a configuration for controlling an oscillator and performing reading-out therefrom according to the second example embodiment.

FIG. 3 is a schematic diagram showing a configuration for controlling the oscillator 20 and performing reading-out therefrom according to this example embodiment. The configuration shown in FIG. 3 is used, for example, as a quantum-bit circuit for a quantum computer as will be described later.

In the configuration shown in FIG. 3, a control unit 50 and a read-out unit 51 are added in the configuration shown in FIG. 2. The control unit 50 is a circuit connected to the magnetic-field generation unit 200 of the oscillator 20, and supplies, to the magnetic-field generation unit 200, a DC current for controlling the oscillation frequency of the oscillator 20 and an AC current for making the oscillator 20 oscillate. The read-out unit 51 is a circuit connected to the resonator 300 through a capacitor 52, and reads out the internal state, i.e., the oscillation state, of the oscillator 20. Note that, in the configuration shown in FIG. 3, the read-out unit 51 is connected to the shunt circuit (the series circuit that is composed of the capacitor 120 and the linear inductor 130, and shunts the loop circuit 110) through the capacitor 52.

Third Example Embodiment

Next, a third example embodiment will be described. In the second example embodiment, the capacitor and the linear inductor, which are used for the shunting, are connected in series. In contrast, in the third example embodiment, the capacitor and the linear inductor, which are used for the shunting, are connected in parallel.

Figure 4:
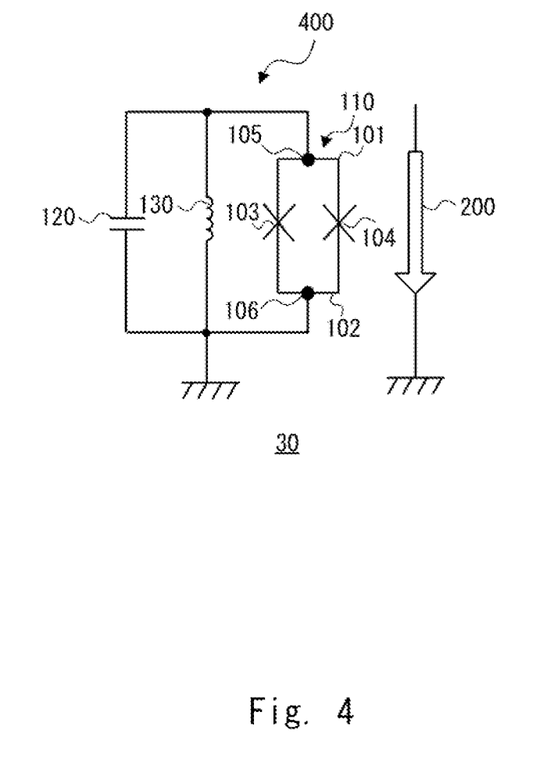
FIG. 4 is a schematic diagram showing a configuration of a Josephson parametric oscillator according to a third example embodiment.

FIG. 4 is a schematic diagram showing a configuration of a superconducting nonlinear oscillator (a Josephson parametric oscillator) according to the third example embodiment. As shown in FIG. 4, the oscillator 30 includes a resonator 400 and a magnetic-field generation unit 200. The resonator 400 includes a loop circuit 110, a capacitor 120, and a linear inductor 130. The loop circuit 110 includes a first superconducting line 101 that connects a first Josephson junction 103 and a second Josephson junction 104, and a second superconducting line 102 that connects the first and second Josephson junctions 103 and 104. In other words, the resonator 400 includes the loop circuit 110 in which the first and second superconducting lines 101 and 102 are joined by the first and second Josephson junctions 103 and 104, the capacitor 120, and the linear inductor 130.

In the resonator 400, the loop circuit 110 is shunted by the circuit in which the capacitor 120 and the linear inductor 130 are connected in parallel. That is, the first part 105 of the first superconducting line 101 and the second part 106 of the second superconducting line 102 are shunted by the capacitor 120 and the linear inductor 130 connected in parallel. In other words, in the resonator 400, the input/output ends of the DC-SQUID are shunted by the capacitor 120 and the linear inductor 130 connected in parallel. That is, it can be said that, by connecting the parallel circuit composed of the capacitor 120 and the linear inductor 130 with the loop circuit 110 in a ring shape, a loop circuit in which the loop circuit 110 is incorporated on the line of the loop is formed. Note that as shown in FIG. 4, one end of the loop circuit may be connected to the ground.

The magnetic-field generation unit 200 and the resonator 400 are magnetically coupled with each other through the mutual inductance. In other words, the magnetic-field generation unit 200 and the resonator 400 are inductively coupled with each other. In the configuration shown in FIG. 4, parametric oscillation is also performed by the generation of an alternating magnetic field. That is, when an AC current is fed to the magnetic-field generation unit 200 so that an alternating magnetic field whose frequency is twice the resonance frequency of the resonator 400 is applied to the loop circuit 110, the oscillator 30 oscillates at this resonance frequency (i.e., the oscillation frequency 0.5 times (i.e., a half of) the frequency of the alternating magnetic field). Note that the frequency of the alternating magnetic field is equal to the frequency of the AC current. Further, in this example embodiment, as can be seen from the Expression (4) and the below-described Expression (11), the oscillation frequency can be controlled by the amount of the current fed to the magnetic-field generation unit 200. Although the magnetic-field generation unit 200 is represented by one wiring line in FIG. 4, it may be formed by two wiring lines, and may be configured so that the DC current flows through one of the wiring lines and the AC current flows through the other wiring line.

The Hamiltonian H of the oscillator 30 shown in FIG. 4 (the Hamiltonian H of the resonator 400) is expressed by the below-shown Expression (9).

[Expression 9]

$$H = hf_0\left(a^\dagger a + \frac{1}{2}\right) - \frac{E_C}{12}\frac{L_r}{L_r + L_J}(a^\dagger + a)^4 \qquad (9)$$

In the Expression (9), $L_r$ is the inductance of the linear inductor 130 shown in FIG. 4. Further, $f_0$ is the oscillation frequency of the oscillator 30. In the Hamiltonian H in the Expression (9), the second term, i.e., the term $(a^\dagger+a)^4$, is the nonlinear term. Therefore, the nonlinear coefficient K of the oscillator 30 in this example embodiment is shown by the below-shown Expression (10).

[Expression 10]

$$K = \frac{E_C}{h}\frac{L_r}{L_r + L_J} = \frac{e^2}{2hC_r}\frac{L_r}{L_r + L_J} = \frac{e^2}{2hC_r}\frac{1}{1 + L_J/L_r} \qquad (10)$$

When $L_r=\infty$ in the Expression (10), the nonlinear coefficient K (i.e., the Expression (10)) becomes identical to the Expression (5). This fact corresponds to the fact that when the linear inductor 130 is removed from the oscillator 30 in this example embodiment, it becomes the nonlinear oscillator shown in FIG. 1. In other words, the oscillator 30 according to this example embodiment is an oscillator that is obtained by inserting the linear inductor 130 in the nonlinear oscillator shown in FIG. 1. As can be seen from the Expression (10), the smaller the inductance $L_r$ of the linear inductor 130 is, the more the nonlinear coefficient K can be reduced. Therefore, in the oscillator 30 according to this example embodiment, it is possible to reduce the nonlinear coefficient K to a moderate value required for a quantum computer without increasing the capacitance $C_r$ of the capacitor 120 used for the shunting. Therefore, it provides an advantageous effect that the nonlinear coefficient can be lowered to a moderate value required for a quantum computer without increasing the loss of the nonlinear oscillator.

Note that the oscillation frequency $f_0$ of the oscillator 30 according to this example embodiment shown in FIG. 4 is expressed by the below-shown Expression (11).

[Expression 11]

$$2\pi f_0 = \frac{1}{\sqrt{\frac{L_r L_J}{L_r + L_J}(C_r + 2C_J)}} \qquad (11)$$

In this example embodiment, the oscillation frequency $f_0$ of the oscillator 30 is also preferably not lower than 5 GHz and not higher than 40 GHz. Further, the critical current value $I_C$ of each of the first and second Josephson junctions 103 and 104 constituting the oscillator 30 is preferably not smaller than 10 nA and not larger than 0.1 mA.

When the critical current value $I_C$ of the Josephson junction is adjusted to a value not smaller than 10 nA and not larger than 0.1 mA, the equivalent inductance $L_J$ of the loop circuit 110 falls within a range of not smaller than 1.85 pH and not larger than 18.5 nH according to the Expression (4). Note that, for the calculation, the value of the magnetic flux Φ was set to $0.3\Phi_0$ in the Expression (4). When the equivalent inductance is not smaller than 1.85 pH and not larger than 18.5 nH, it is possible to adopt, based on the Expression (11), various combinations of the inductance $L_r$ and the capacitance $C_r$ with which the oscillation frequency $f_0$ of the oscillator 30 falls within the range of not lower than 5 GHz and not higher than 40 GHz. From among such combinations, by using (i.e., selecting) a combination of the inductance $L_r$ and the capacitance $C_r$ with which the nonlinear coefficient K in the Expression (10) can be adjusted to a value not lower than 1 MHz and not higher than 10 MHz, it is possible to realize a nonlinear oscillator having a moderate nonlinearity required for a quantum computer.

For example, assume that: the oscillation frequency $f_0$ is selected to be 10 GHz; the critical current value $I_C$ of the Josephson junction is 0.83 μA; the capacitance $C_r$ is 0.57 pF; and the inductance $L_r$ is 30 pH. Then, the nonlinear coefficient K is calculated as 4.0 MHz. That is, in this case, it is possible to achieve a moderate nonlinearity required for a quantum computer.

As described above, the value of the inductance of the linear inductor 130 is set in advance based on the equivalent inductance $L_J$, the oscillation frequency $f_0$, the critical current value $I_C$ of the Josephson junction(s), and the capacitance $C_r$ so that the nonlinear coefficient K has a predetermined value. That is, the linear inductor 130 is designed so that its inductance is not a floating inductance but has a predetermined value. In other words, the linear inductor 130 is an inductor that exists as a non-floating component.

Figure 5:
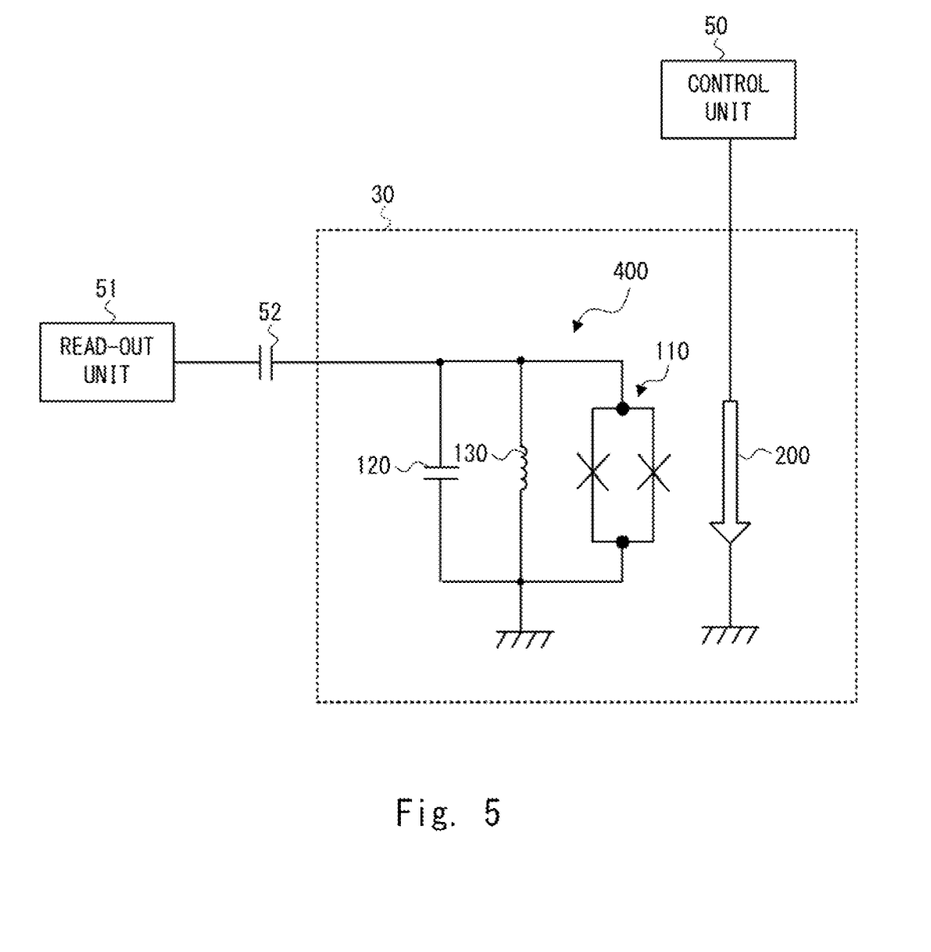
FIG. 5 shows a configuration for controlling an oscillator and performing reading-out therefrom according to the third example embodiment.

FIG. 5 shows a configuration for controlling the oscillator 30 and performing reading-out therefrom according to this example embodiment. The configuration shown in FIG. 5 is used, for example, as a quantum-bit circuit for a quantum computer as will be described later.

In the configuration shown in FIG. 5, a control unit 50 and a read-out unit 51 are added in the configuration shown in FIG. 4 as in the case of the configuration shown in FIG. 3. Note that, in the configuration shown in FIG. 5, the read-out unit 51 is connected to the shunt circuit (the parallel circuit that is composed of the capacitor 120 and the linear inductor 130, and shunts the loop circuit 110) through the capacitor 52.

Fourth Example Embodiment

Next, an example embodiment in which the oscillator 20 or 30 shown in the second or third example embodiment is used as a quantum-bit circuit for a quantum computer will be described. Note that the term "quantum computer" means a quantum annealing-type computer that calculates a solution of an arbitrary problem that can be mapped onto an Ising model. As described above, each of the oscillators 20 and 30 performs parametric oscillation when an alternating magnetic field having a frequency twice the resonance frequency is applied to its loop circuit 110. Note that the oscillation state can be either a first oscillation state or a second oscillation state the phases of which are different from each other by $\pi$. The first and second oscillation states correspond to quantum bits 0 and 1, respectively.

Figure 6:
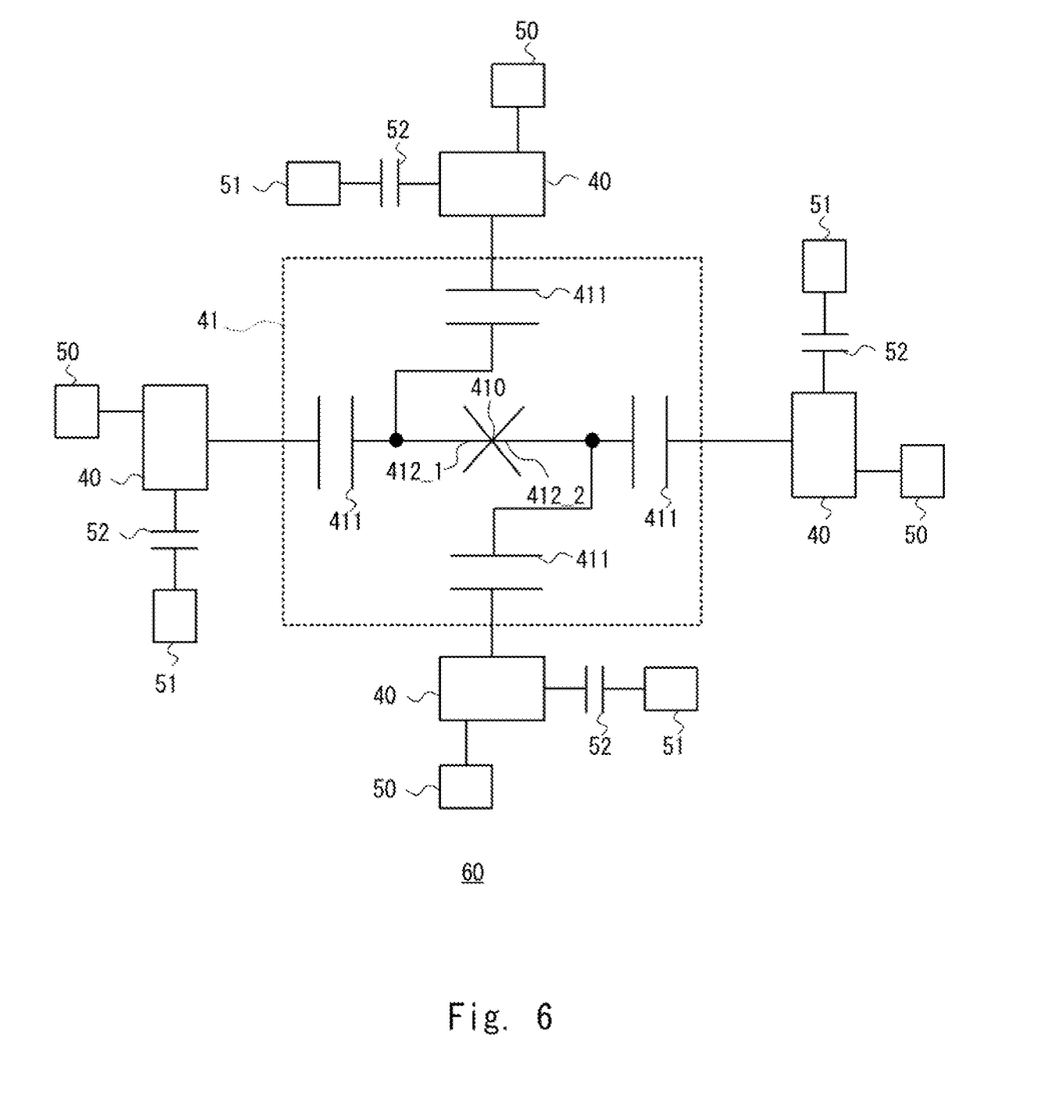
FIG. 6 is a schematic diagram showing a configuration of a quantum computer using the oscillator shown in the second or third example embodiment.

FIG. 6 is a schematic diagram showing a configuration of a quantum computer using the oscillator shown in the second or third example embodiment. The configuration shown in FIG. 6 is a configuration that is obtained by, in the configuration of the quantum computer using a distributed constant-type superconducting parametric oscillator disclosed in Non-patent Literature 1, applying the above-described oscillator 20 or 30 in place of the distributed constant-type superconducting parametric oscillator. More specifically, the configuration shown in FIG. 6 is obtained by, for example, in the configuration shown in FIG. 4 of Non-patent Literature 1, applying the above-described oscillator 20 or 30 in place of the distributed constant-type superconducting parametric oscillator. In FIG. 6, the oscillator 40 represents the oscillator 20 or 30.

In the quantum computer 60 shown in FIG. 6, four oscillators 40 are connected by one coupling circuit 41. More specifically, when the oscillator 40 is the resonator 20, the coupling circuit 41 is connected to the shunt circuit of the resonator 20 (the series circuit that is composed of the capacitor 120 and the linear inductor 130, and shunts the loop circuit 110). Similarly, when the oscillator 40 is the oscillator 30, the coupling circuit 41 is connected to the shunt circuit of the oscillator 30 (the parallel circuit that is composed of the capacitor 120 and the linear inductor 130, and shunts the loop circuit 110). As shown in FIG. 3 or 5, the control unit 50 and the read-out unit 51 are connected to each oscillator 40. That is, the control unit 50 is connected to the magnetic-field generation unit 200 of the oscillator 40. Further, the read-out unit 51 is connected to the above-described shunt circuit of the oscillator 40 through the capacitor 52. The coupling circuit 41 is a circuit that couples the four oscillators 40, and is formed by one Josephson junction 410 and four capacitors 411. More specifically, the coupling circuit 41 couples ring circuits each of which includes the capacitor 120 and the loop circuit 110 in oscillators with each other. The coupling circuit 41 couples a first set of oscillators composed of two of the four oscillators 40 with a second set of oscillators composed of the other two oscillators 40 through the Josephson junction 410. Note that each of the first set of oscillators is connected to a superconductor 412_1 through a respective capacitor 411. Further, each of the second set of oscillators is connected to a superconductor 412_2 through a respective capacitor 411. Note that the superconductor 412_1 is a wiring line connected to one of the terminals of the Josephson junction 410, and the superconductor 412_2 is a wiring line connected to the other terminal of the Josephson junction 410.

That is, it can be said that the superconductors 412_1 and 412_2 are joined by the Josephson junction 410. That is, a first oscillator 40 in the first set of oscillators is connected to one of the terminals of the Josephson junction 410 through a first capacitor 411. Further, a second oscillator 40 in the first set of oscillators is connected to one of the terminals of the Josephson junction 410 through a second capacitor 411. Similarly, a third oscillator 40 in the second set of oscillators is connected to the other terminal of the Josephson junction 410 through a third capacitor 411. Further, a fourth oscillator 40 in the second set of oscillators is connected to the other terminal of the Josephson junction 410 through a fourth capacitor 411.

The control unit 50 uses AC currents having frequencies different from each other for the four oscillators 40. When the magnetic-field generation unit 200 is formed by two wiring lines, and a DC current is fed to one of the wiring lines and an AC current is fed to the other wiring line, the wiring line for the AC current may be a wiring line that is shared (i.e., commonly used) by a plurality of oscillators 40. That is, the wiring line for the AC current may be formed so as to pass through (or pass near) the plurality of the oscillators 40. In this case, in order to control the plurality of oscillators 40, a plurality of current control units 50 are connected to the wiring line for the AC current, which is shared by the plurality of oscillators 40. Further, AC currents having frequencies different from each other are superimposed by the current control units 50.

Note that, in the configuration shown in FIG. 6, the control units 50 may be arranged in a distributed manner in order to control the respective oscillators 40. Alternatively, the plurality of control units 50 may be collectively disposed in one place. Further, although the four read-out units 51 are used in the configuration shown in FIG. 6, one read-out unit 51 may read out the internal states of the four oscillators 40. In this case, the common read-out unit 51 provided for the plurality of oscillators 40 reads out the internal state of each of the oscillators 40 while distinguishing them from each other according to the difference in the frequencies used in the respective oscillators 40.

Figure 7:
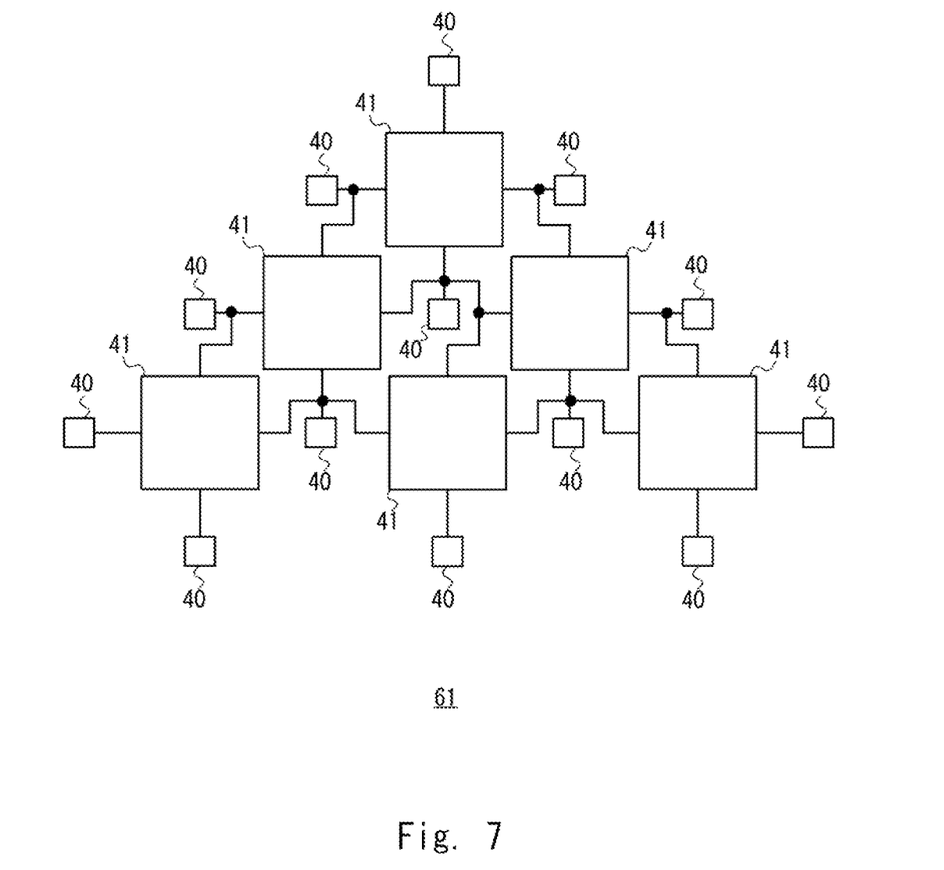
FIG. 7 is a schematic diagram showing a configuration of a quantum computer in which oscillators are integrated.

Note that the configuration shown in FIG. 6 shows a configuration of a quantum computer including four oscillators 40. However, it is possible to realize a quantum computer in which an arbitrary number of oscillators 40 are integrated by using the configuration shown in FIG. 6 as a unit structure and connecting a plurality of such unit structures side by side. FIG. 7 shows an example of such a configuration. FIG. 7 shows a schematic diagram showing a configuration of a quantum computer 61 in which oscillators 40 are integrated. In the configuration shown in FIG. 7, each coupling circuit 41 is connected to four oscillators 40 as shown in FIG. 6. Further, each oscillator 40 is connected to one to four coupling circuits 41, and the oscillators 40 are arranged while shared (i.e., commonly used) by a plurality of unit structures, so that the unit structures shown in FIG. 6 is obtained. In the quantum computer 61, at least one oscillator 40 is connected to a plurality of coupling circuits 41. In particular, in the example shown in FIG. 7, at least one oscillator 40 is connected to four coupling circuits 41. Further, the quantum computer 61 can also be described as follows. The quantum computer 61 includes a plurality of oscillators 40, and each of the oscillators 40 is connected to one to four coupling circuits 41. The number of coupling circuits 41 to which respective oscillators 40 are connected corresponds to the number of unit structures in which these oscillators 40 are shared. In this way, in the example shown in FIG. 7, the quantum computer 61 includes a plurality of unit structures, and oscillators 40 are shared by a plurality of unit structures. Although 13 superconducting nonlinear oscillators are integrated in the example shown in FIG. 7, an arbitrary number of oscillators 40 can be integrated in a similar manner.

Note that illustration of the control unit 50 and the read-out unit 51 is omitted in FIG. 7 to facilitate the understanding of the drawing. However, in practice, the control of the oscillator 40 and the reading-out therefrom are performed by using the control unit 50 and the read-out unit 51. Further, the operating principle and the control method for a quantum computer are disclosed in Non-patent Literature 1, and the operating principle and the control method disclosed in Non-patent Literature 1 are also applied to the quantum computer shown in FIGS. 6 and 7.

According to this example embodiment, it is possible to provide a quantum computer in which both moderate nonlinearity and a low loss are achieved, and the area occupied by the circuit can be reduced.

Note that a superconducting nonlinear oscillator according to the present disclosure can be applied to gate-type quantum computing circuits as well as to quantum annealing circuits.

Further, in the fourth example embodiment, an example embodiment in which the oscillator 20 or 30 shown in the second or third example embodiment is used as a quantum-bit circuit for a quantum computer has been described as a preferred example embodiment. However, the oscillator 10 shown in the first example embodiment may also be used in the fourth example embodiment.

Note that the present invention is not limited to the above-described example embodiments and various changes may be made therein without departing from the spirit and scope of the invention.

Although the present invention is described above with reference to example embodiments, the present invention is not limited to the above-described example embodiments. Various modifications that can be understood by those skilled in the art can be made to the configuration and details of the present invention within the scope of the invention.

This application is based upon and claims the benefit of priority from Japanese patent application No. 2019-133814, filed on Jul. 19, 2019, the disclosure of which is incorporated herein in its entirety by reference.

REFERENCE SIGNS LIST

10 OSCILLATOR
20 OSCILLATOR
30 OSCILLATOR
40 OSCILLATOR
41 COUPLING CIRCUIT
50 CONTROL UNIT
51 READ-OUT UNIT
52 CAPACITOR
60 QUANTUM COMPUTER
61 QUANTUM COMPUTER
100 RESONATOR
101 FIRST SUPERCONDUCTING LINE
102 SECOND SUPERCONDUCTING LINE
103 FIRST JOSEPHSON JUNCTION
104 SECOND JOSEPHSON JUNCTION
105 FIRST PART
106 SECOND PART
110 LOOP CIRCUIT
120 CAPACITOR
130 LINEAR INDUCTOR
200 MAGNETIC-FIELD GENERATION UNIT
300 RESONATOR
400 RESONATOR
410 JOSEPHSON JUNCTION
411 CAPACITOR
412_1 SUPERCONDUCTOR
412_2 SUPERCONDUCTOR

What is claimed is:

1. A quantum computer comprising, as a unit structure, four oscillators and a coupling circuit configured to couple the four oscillators with each other, wherein
   each of the four oscillator comprises a resonator, the resonator comprising:
      a loop circuit in which a first superconducting line, a first Josephson junction, a second superconducting line, and a second Josephson junction are connected in a ring shape; and
      a capacitor, and
   the capacitor and the loop circuit are connected in a ring shape.

2. The quantum computer according to claim 1, wherein the resonator further comprises a linear inductor, and
a circuit comprising the capacitor and the linear inductor and the loop circuit are connected in a ring shape.

3. The quantum computer according to claim 2, wherein the capacitor and the linear inductor are connected in series.

4. The quantum computer according to claim 2, wherein the capacitor and the linear inductor are connected in parallel.

5. The quantum computer according to claim 2, wherein a value of an inductance of the linear inductor is set in advance based on an equivalent inductance of the loop circuit, an oscillation frequency of the loop circuit, critical current values of the first and second Josephson junctions, and a capacitance of the capacitor so that a coefficient of a nonlinear term of a Hamiltonian of the resonator has a predetermined value.

6. The quantum computer according to claim 1, wherein
   the coupling circuit couples a first set of oscillators including two of the four oscillators with a second set of oscillators including the other two of the four oscillators through a third Josephson junction,
   a first oscillator of the first set of oscillators is connected to one terminal of the third Josephson junction through a first capacitor,
   a second oscillator of the first set of oscillators is connected to the one terminal of the third Josephson junction through a second capacitor,
   a third oscillator of the second set of oscillators is connected to the other terminal of the third Josephson junction through a third capacitor, and a fourth oscillator of the second set of oscillators is connected to the other terminal of the third Josephson junction through a fourth capacitor.

7. The quantum computer according to claim 1, comprising a plurality of the unit structures, wherein
each oscillator is commonly used by a plurality of the unit structures.

8. The quantum computer according to claim 1, wherein
each of the four oscillators further comprises a magnetic-field generating circuit for applying a magnetic field to the loop circuit.

9. The quantum computer according to claim 1, wherein
a capacitance of the capacitor is not larger than 1 pF.

10. The quantum computer according to claim 1, wherein
a value of a nonlinear coefficient of the resonator is not lower than 1 MHz and not higher than 10 MHz.

\* \* \* \* \*